United States Patent
Nakamura

(10) Patent No.: US 8,345,496 B2
(45) Date of Patent: Jan. 1, 2013

(54) MEMORY TEST APPARATUS AND TESTING METHOD

(75) Inventor: Takashi Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 82 days.

(21) Appl. No.: 12/990,983

(22) PCT Filed: May 7, 2009

(86) PCT No.: PCT/JP2009/002011
§ 371 (c)(1),
(2), (4) Date: Jan. 24, 2011

(87) PCT Pub. No.: WO2009/136503
PCT Pub. Date: Nov. 12, 2009

(65) Prior Publication Data
US 2011/0116333 A1    May 19, 2011

(30) Foreign Application Priority Data
May 9, 2008    (JP) ................................ 2008-123353

(51) Int. Cl.
*G11C 29/00*    (2006.01)
(52) U.S. Cl. ........................ 365/201; 365/222
(58) Field of Classification Search ................ 365/201, 365/222
See application file for complete search history.

(56) References Cited

U.S. PATENT DOCUMENTS

| | | | | |
|---|---|---|---|---|
| 6,138,259 | A * | 10/2000 | Tsuto | 714/738 |
| 7,114,025 | B2 * | 9/2006 | Kanda et al. | 365/222 |
| 7,444,577 | B2 * | 10/2008 | Best et al. | 365/201 |
| 7,734,866 | B2 * | 6/2010 | Tsern | 365/222 |
| 2004/0233745 | A1 * | 11/2004 | Ohlhoff | 365/202 |
| 2006/0285413 | A1 * | 12/2006 | Shinozaki et al. | 365/222 |
| 2011/0292710 | A1 * | 12/2011 | Matsubayashi et al. | 365/94 |

FOREIGN PATENT DOCUMENTS

| | | |
|---|---|---|
| JP | 64-064050 | 9/1989 |
| JP | 6-236683 A | 8/1994 |
| JP | 06-236683 A | 8/1994 |
| JP | 8-327703 A | 12/1996 |
| JP | 11-007763 A | 1/1999 |
| JP | 11-7763 A | 1/1999 |

OTHER PUBLICATIONS

Office Action issued for corr. Korean Patent App. 10-2010-7027646 dated Mar. 24, 2012 and its English translation.
PCT International Search Report for PCT Application No. PCT/JP2009/002011 mailed on Aug. 4, 2009, with an English-language translation.
PCT Written Opinion for PCT Application No. PCT/JP2009/002011 mailed on Aug. 4, 2009, with an English-language translation.
PCT International Preliminary Report on Patentability for PCT Application No. PCT/JP2009/002011 mailed on Nov. 9, 2010.
Office Action issued for related JP App No. 2008-123353 dated Jul. 17, 2012, and its English summary.

* cited by examiner

*Primary Examiner* — Tuan T. Nguyen
(74) *Attorney, Agent, or Firm* — Ladas & Parry, LLP

(57) ABSTRACT

A refresh control circuit receives an interrupt signal, which is a request to refresh DRAM (Dynamic Random Access Memory) and which is asserted at predetermined timings. The refresh control circuit counts the number of times the interrupt signal is asserted, and asserts an interrupt subroutine start signal, which is an instruction to refresh the DRAM, in an idle state in which the DRAM is accessible from an external circuit, for a number of times that is equal to the number of times thus counted. When the interrupt subroutine start signal is asserted, a refresh circuit executes a predetermined interrupt subroutine, and supplies a refresh pattern to the DRAM.

15 Claims, 8 Drawing Sheets

MEMORY TEST APPARATUS AND TESTING METHOD

CROSS REFERENCE TO RELATED APPLICATIONS

This application is the U.S. National Stage of International Patent Application No. PCT/JP2009/002011 filed on May 7, 2009 which claims priority to Japanese Patent Application No. 2008-123353 filed on May 9, 2008, the disclosures of which are hereby incorporated by reference in their entirety.

BACKGROUND OF THE INVENTION

1. Field of the Invention

The present invention relates to a test apparatus for memory and a test method thereof.

2. Description of the Related Art

As a main storage unit of a computer such as a personal computer, workstation, etc., DRAM (Dynamic Random Access Memory) is employed. DRAM uses a capacitor to hold charge, thereby holding data that is 0 or 1. The charge thus stored in the capacitor is discharged via a discharge path. Accordingly, there is a need to repeatedly perform a refresh operation, in which the data thus stored is temporarily read out and the data thus read out is written again, at a rate of several times per second.

Such a refresh operation is required in the DRAM testing process. Thus, a DRAM test apparatus mounts an algorithmic pattern generator (ALPG) having a timer configured to instruct the DRAM that is the device under test (DUT) to generate a refresh pattern.

The timer generates an interrupt signal which is an instruction to generate a refresh pattern at regular intervals. Typically, the cycle in which a refresh pattern is allowed to be generated within a test pattern generating program configured to test the DUT corresponds to the timing at which the DUT enters the idle state (access waiting state). The test apparatus includes an ALPG program counter having a function of detecting whether or not an interrupt signal occurs at this timing, and a function of generating an interrupt subroutine configured to generate a refresh pattern. In the active state of the DUT (the state in which the DUT is accessed), such an arrangement does not allow a refresh pattern to be generated. Thus, such a refresh pattern is not generated before the cycle enters the idle state cycle.

With conventional program counter circuits, in a case in which the interrupt signal is asserted twice or more when the DUT is accessed for a long period of time, only the first assertion event is held. This leads to a problem in that the refresh operation is performed only once after the cycle enters the cycle in which the refresh operation is allowed. Because of this, situations arise in which the number of times the refresh operation is performed during execution of the test pattern operation is insufficient, resulting in the stored data being damaged. In general, DRAM data is not damaged even if the refresh rate is slightly less than standard. However, depending upon the test conditions such as the voltage and temperature, and the individual difference in properties of the DUTs, in some cases, the data is damaged, and in some cases, the data is not damaged, even if the test is executed using the same test pattern. In particular, in a case in which the data has been damaged, it is difficult to identify the cause of the damage.

SUMMARY OF THE INVENTION

The present invention has been made in order to solve such a problem. Accordingly, it is a general purpose of the present invention to provide a test apparatus and a test method thereof, configured to suppress data damage due to the DRAM being refreshed an insufficient number of times.

An embodiment of the present invention relates to a test apparatus for DRAM (Dynamic Random Access Memory). The test apparatus comprises: a refresh control circuit configured to receive an interrupt signal which is asserted at predetermined timings and which is a request to refresh the DRAM, to count the number of times the interrupt signal is asserted, and to assert an interrupt subroutine start signal in order to refresh the DRAM in an idle state in which the DRAM is accessible from an external circuit, for a number of times that is equal to the number of times thus counted; and a refresh circuit configured to execute a predetermined interrupt subroutine so as to supply a refresh pattern to the DRAM when the interrupt subroutine start signal is asserted.

With such an embodiment, the number of times the interrupt signal is asserted is held. Thus, such an arrangement is capable of executing the refresh operation a necessary number of times in a sure manner. This prevents the data stored in the DRAM from being damaged.

Also, the refresh control circuit may comprise a counter configured to count up when the interrupt signal is asserted, and to count down when the refresh circuit starts the interrupt subroutine.

By employing such an up/down counter, such an arrangement is capable of appropriately holding the number of times the refresh operation is to be executed.

Also, the refresh control circuit may comprise an interrupt subroutine start signal generating unit configured to generate the interrupt subroutine start signal. Also, the interrupt subroutine start signal generating unit may be configured to assert the interrupt subroutine start signal in a state selected from among a state in which the DRAM is in the idle state, the refresh circuit is not executing the interrupt subroutine, and the count value of the counter is not zero, and a state in which the refresh circuit is executing the interrupt subroutine, the DRAM is in the idle state, the count value is not zero, and a return signal, which indicates return of the flow from a subroutine, is asserted.

Also, when the interrupt subroutine start signal is asserted, the counter may count down.

By referring to the interrupt subroutine start signal, such an arrangement is capable of executing the counting down operation in a sure manner according to the start of the interrupt subroutine.

Also, the interrupt subroutine start signal generating unit may generate an interrupt subroutine return signal, which indicates return of the flow from the interrupt subroutine, in addition to the interrupt subroutine start signal. Also, the interrupt subroutine start signal generating unit may assert the interrupt subroutine return signal in a state selected from among a state in which the refresh circuit is executing the interrupt subroutine, the DRAM is not in the idle state, and the return signal, which indicates return of the flow from the subroutine, is asserted, and a state in which the refresh circuit is executing the interrupt subroutine, the count value of the counter is zero, and the return signal, which indicates return of the flow from the subroutine, is asserted.

Also, the refresh control circuit may further comprise an interrupt start signal generating unit and an interrupt judgment signal generating unit. The interrupt start signal generating unit is configured to generate an interrupt start signal which is asserted when the DRAM is in the idle state, the refresh circuit is not executing the interrupt subroutine, and the count value of the counter is not zero. The interrupt judgment signal generating unit is configured to generate an interrupt judgment signal that indicates that the refresh circuit is executing the interrupt subroutine. With such an arrangement, the interrupt judgment signal generating unit may assert the interrupt judgment signal when the interrupt start signal is asserted. Also, the interrupt judgment signal generating unit may negate the interrupt judgment signal when the interrupt subroutine return signal is asserted in a state in which the interrupt start signal is negated. Also, the interrupt judgment signal generating unit may hold the interrupt judgment signal at its previous value when the interrupt subroutine return signal is negated in a state in which the interrupt start signal is negated.

Also, the refresh control circuit may comprise a refresh error signal generating unit configured to generate a refresh error signal which is asserted when the count value of the counter exceeds a predetermined upper limit value. Also, when the refresh error signal is asserted, the test apparatus may stop the operation of the pattern generator configured to generate the interrupt signal.

If an error occurs in the DRAM, the DRAM is in danger of being in a non-idle state for a long period of time. The count value of the counter can be used to perform error handling in such a situation.

Also, an initial value of the count value of the counter may be set via an external circuit. By supplying an initial value to the counter before the test pattern is executed, such an arrangement ensures that the DRAM is refreshed for the set number of times.

Another embodiment of the present invention relates to a test method for DRAM (Dynamic Random Access Memory). With the test method, the following steps are executed.

1. Generating an interrupt signal which is asserted at predetermined timings and which is a request to refresh the DRAM.

2. Counting the number of times the interrupt signal is asserted.

3. Asserting an interrupt subroutine start signal in order to refresh the DRAM in an idle state in which the DRAM is accessible from an external circuit, for a number of times that is equal to the number of times thus counted.

4. Executing a predetermined interrupt subroutine so as to supply a refresh pattern to the DRAM when the interrupt subroutine start signal is asserted.

With such an embodiment, the number of times the interrupt signal is asserted is held. Thus, such an arrangement is capable of executing the refresh operation a necessary number of times in a sure manner. This prevents the data stored in the DRAM from being damaged.

It should be noted that any combination of the aforementioned components and any manifestation of the present invention may be mutually substituted between a method, apparatus, program, medium storing a program, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
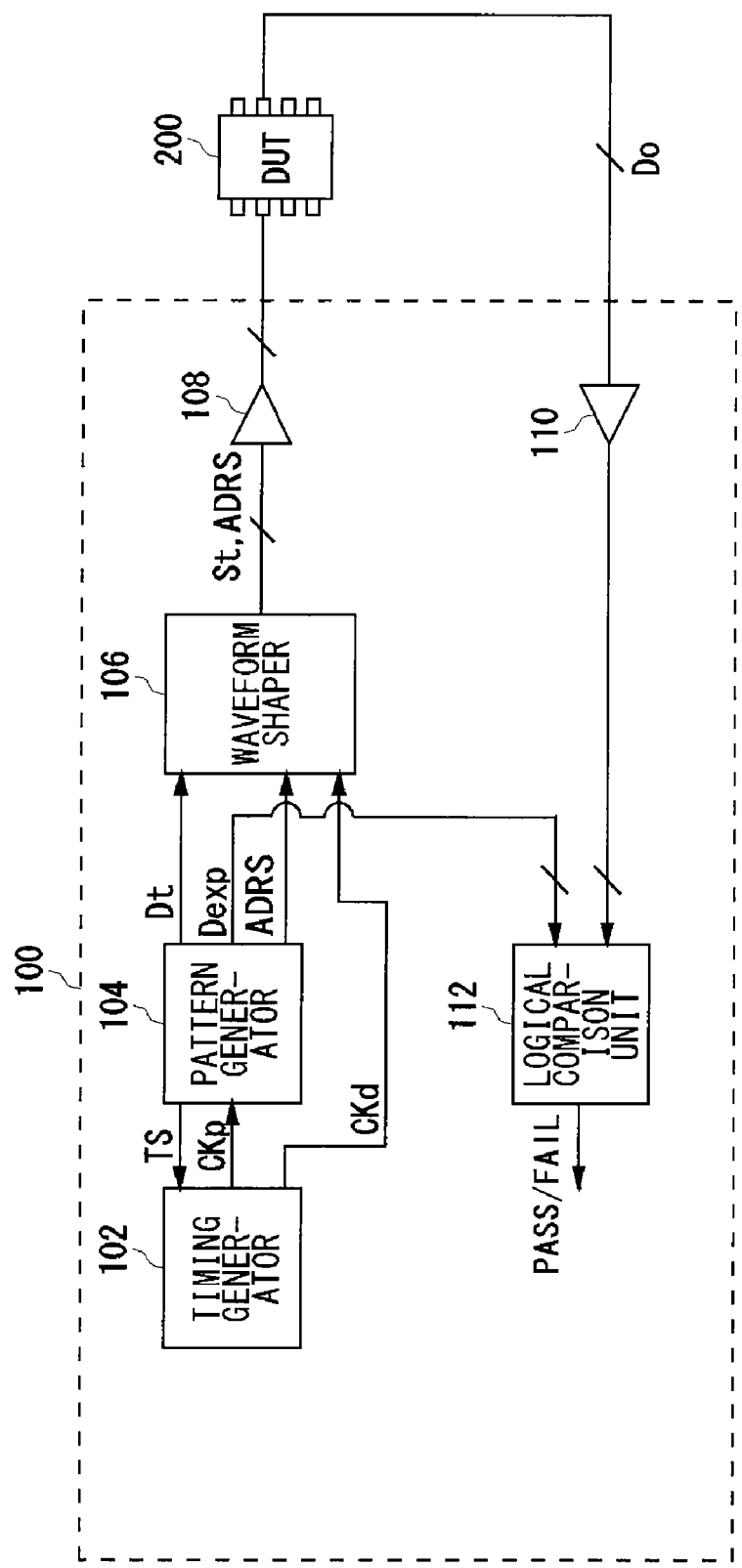
FIG. 1 is a block diagram which shows an overall configuration of a test apparatus according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

FIG. 1 is a block diagram which shows an overall configuration of a test apparatus 100 according to an embodiment.

The test apparatus 100 has a function of judging the quality of DRAM 200 which is a DUT, or a function of identifying the damaged position.

The test apparatus 100 includes a timing generator 102, a pattern generator 104, a waveform shaper 106, a write driver 108, a comparator 110, and a logical comparison unit 112.

The pattern generator 104 generates a timing set signal (which will be referred to as the "TS signal" hereafter), and supplies the timing set signal thus generated to the timing generator 102. The timing generator 102 generates a cycle clock CKp and a delayed clock CKd based upon the timing data indicated by the TS signal. The timing generator 102 supplies the cycle clock signal CKp to the pattern generator 104, and supplies the delayed clock CKd to the waveform shaper 106. Subsequently, the pattern generator 104 generates address data ADRS which indicates the addresses of blocks which are multiple storage regions included in the DRAM 200 and multiple test pattern data Dt to be written to the respective multiple blocks. The pattern generator 104 supplies the address data ADRESS and the test pattern data signal St to the waveform shaper 106.

The waveform shaper 106 generates a test pattern signal St that corresponds to the test pattern data Dt thus generated by the pattern generator 104, according to the delayed clock CKd supplied from the timing generator 102. With such an arrangement, the waveform shaper 106 supplies the address data ADRS supplied from the pattern generator 104 and the test pattern signal St thus generated to the DRAM 200 via the write driver 108.

Furthermore, the pattern generator 104 generates expected value data Dexp beforehand, which is the output data to be output from the DRAM 200 according to the address data ADRS and the test pattern signal St, and supplies the expected value data Dexp to the logical comparison unit 112.

The comparator 110 reads out, from the DRAM 200, data Do that corresponds to the address data ADRS, and outputs the data Do thus read out to the logical comparison unit 112. The logical comparison unit 112 compares the data thus read out from the DRAM 200 with the expected value data Dexp supplied from the pattern generator 104 so as to judge the quality of the DRAM 200.

The test apparatus 100 refreshes the DRAM 200 at a predetermined timing during execution of the aforementioned test. The refresh operation of the DRAM 200 is a feature of the test apparatus 100 according to the embodiment. It should be noted that the configuration of the test apparatus 100 is not restricted to an arrangement shown in FIG. 1.

Figure 2:
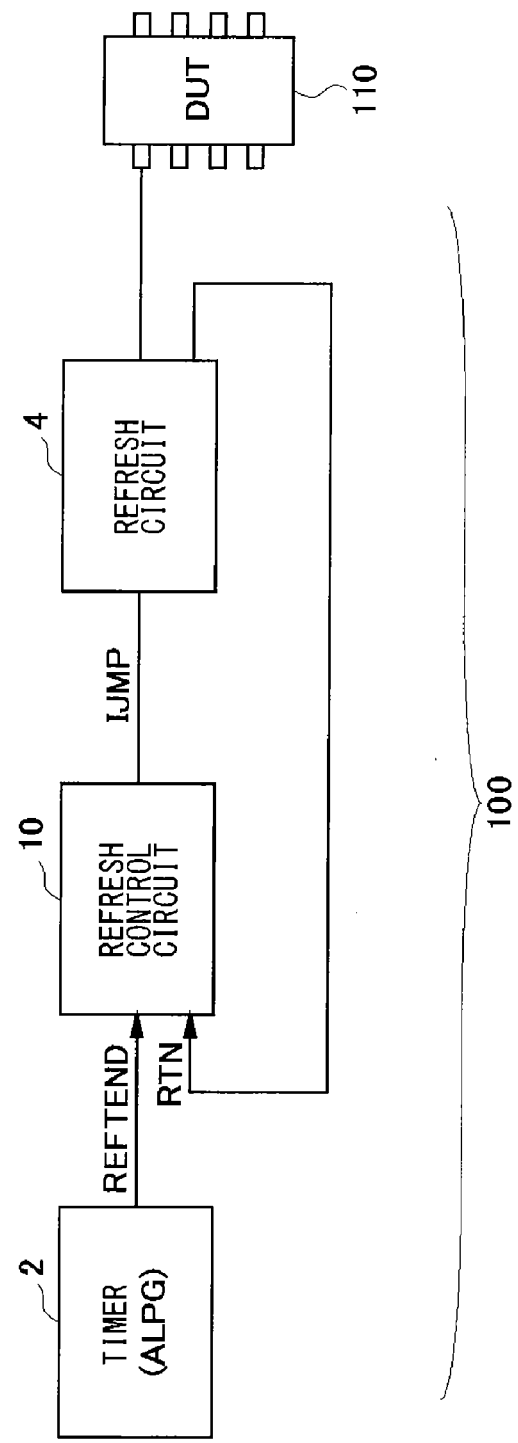
FIG. 2 is a block diagram which shows a refresh operation of the test apparatus according to an embodiment.

FIG. 2 is a block diagram which shows a refresh operation of the test apparatus 100 according to an embodiment. The test apparatus 100 includes a timer 2, a refresh circuit 4, and a refresh control circuit 10. The block diagram in FIG. 1 shows only a peripheral circuit of the refresh circuit configured to refresh the DRAM 200, and the other circuit blocks are not shown. It should be noted that the components shown in the drawings in the form of functional blocks that provide various processing can be realized by hardware means, e.g., by means of a CPU, memory, a function circuit, and other LSIs, or by software means, e.g., by means of a program loaded into memory. Accordingly, such functional blocks can be realized by hardware components alone, software components alone, or various combinations thereof, which can be readily conceived by those skilled in this art. That is to say, each functional block is not restricted to hardware components alone or software components alone.

The timer 2 is included as a built-in component in the algorithmic pattern generator ALPG, and is configured to generate an interrupt signal REFTEND (REFresh Time END) which is a request to refresh the DRAM. The timer 2 asserts the interrupt signal REFTEND at a predetermined timing.

The refresh control circuit 10 receives an interrupt signal (REFTEND) which is asserted at a predetermined timing, and counts the number of times the interrupt signal REFTEND is asserted. In the idle state, in which the DRAM 200 is accessible from an external circuit, the refresh control circuit 10 asserts an interrupt subroutine start signal IJMP for a number of times equal to the counted number of times that the interrupt signal was asserted.

When the interrupt subroutine start signal IJMP is asserted, the refresh circuit 4 executes a predetermined interrupt subroutine, and supplies a refresh pattern to the DRAM 200.

The above is the schematic configuration of the refresh control circuit 10 according to the embodiment. The refresh control circuit 10 holds the number of times the interrupt signal REFTEND is asserted. Thus, such an arrangement ensures that the refresh operation is executed for a required number of times, thereby preventing the data stored in the DRAM 200 from being damaged.

Figure 3:
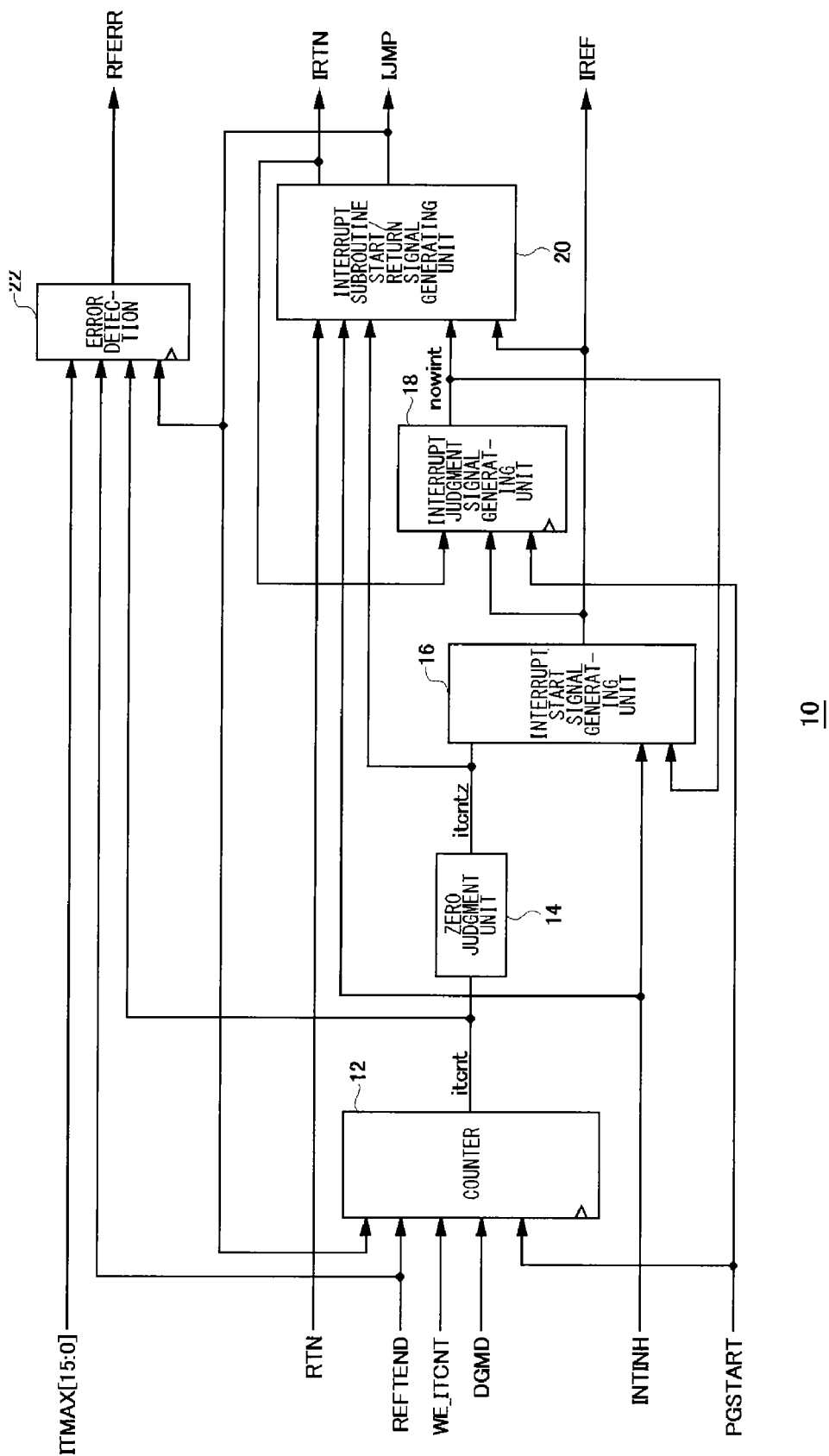
FIG. 3 is a block diagram which shows a configuration of a refresh control circuit.

Next, detailed description will be made regarding a configuration which provides a function of the above-described refresh control circuit 10. FIG. 3 is a block diagram which shows a configuration of the refresh control circuit 10. The refresh control circuit 10 includes a counter 12, a zero judgment unit 14, an interrupt start signal generating unit 16, an interrupt judgment signal generating unit 18, an interrupt subroutine start signal generating unit 20, and a refresh error signal generating unit 22.

The refresh control circuit 10 receives, as input signals from external circuits, an interrupt signal REFTEND, a return signal RTN, a maximum count setting signal ITMAX[15:0], an interrupt inhibit signal INTINH, a start signal PGSTART, a mode signal DGMD, a write data signal WBUS[15:0], and a write command signal WE_ITCNT.

Furthermore, the refresh control circuit 10 generates a refresh error signal REFERR, an interrupt start signal IREF, and an interrupt subroutine return signal IRTN, in addition to the aforementioned interrupt subroutine start signal IJMP.

In the present specification, each signal generated by an internal component of the refresh control circuit 10 will be written in lowercase letters. Each signal input from an external circuit, or each signal output to an external circuit will be written in uppercase letters.

When the interrupt signal REFTEND is asserted, the counter 12 counts up, and when the refresh circuit 4 starts the interrupt subroutine, the counter 12 counts down. By using such an up/down counter, such an arrangement is capable of holding the difference between the number of times an instruction is given to perform the refresh operation and the number of times the refresh operation is executed. In other words, such an arrangement holds, as a count value itcnt, the number of times the refresh operation is to be executed at the current time point.

The zero judgment unit 14 judges whether or not the count value itcnt is equal to zero, and generates a zero judgment signal itcntz that corresponds to the judgment result. When the count value itcntz is zero, the zero judgment unit 14 is asserted. That is to say, it is represented by the following Expression.

$$itcntz = (itcnt == 0)$$

Here, the symbol "=" represents substitution of the value of the right side into the symbol of the left side. The symbol "==" represents an operator for returning "TRUE" when the two values are equal.

The interrupt subroutine start signal generating unit 20 generates an interrupt subroutine start signal IJMP. The interrupt subroutine start signal IJMP is a signal which functions as a trigger used to generate a pattern address signal in the ALPG. Accordingly, the interrupt subroutine start signal IJMP is asserted at a timing at which the interrupt subroutine is to be newly started (condition 1) or a timing at which the interrupt subroutine is to be executed again immediately after the flow returns from the interrupt subroutine (condition 2).

Condition 1 and condition 2 are as follows.

Condition 1: The DRAM 200 is in the idle state, the refresh circuit 4 is not in the state of executing the interrupt subroutine, and the count value itcnt of the counter 12 is not zero.

Condition 2: The refresh circuit 4 is in the state of executing the interrupt subroutine, the DRAM 200 is in the idle state, the count value itcnt is not zero, and the return signal RTN which indicates that the flow is returned from the subroutine is asserted.

Judgment of whether or not the DRAM 200 is in the idle state is made according to the interrupt inhibit signal INTINH. When the DRAM 200 is in the active state, i.e., when access to the DRAM 200 from an external circuit is inhibited, the interrupt inhibit signal INTINH is asserted. When the DRAM 200 is in the idle state, i.e., when an external circuit is allowed to access the DRAM 200, the interrupt inhibit signal is negated.

Judgment of whether or not the refresh circuit 4 is executing the interrupt subroutine is made according to an interrupt judgment signal nowint. The interrupt judgment signal nowint is generated by the interrupt judgment signal generating unit 18 described later, and is asserted when the interrupt subroutine is being executed.

The return signal RTN is one of the pattern generating commands (instructions), and is a signal which functions as an instruction to return from a given subroutine. That is to say, the return signal RTN is asserted in the return cycle from the interrupt subroutine for performing the refresh operation.

The interrupt start signal generating unit 16 generates an interrupt start signal IREF which is asserted when the condition 1 is satisfied. That is to say, The interrupt start signal IREF is represented by the following Expression.

$$IREF=(!(INTINH|nowint)) \& (!itcntz) \quad (1)$$

Here the symbol "!" represents logical NOT, the symbol "&" represents logical AND, and the symbol "|" represents logical OR.

When the following logical Expression (2) holds true, condition 2 is satisfied.

$$(nowint \& (!(INTINH|itcntz))) \& RTN \quad (2)$$

Thus, the interrupt subroutine start signal IJMP generated by the interrupt subroutine start signal generating unit 20 is represented by the following logical Expression (3).

$$IJMP=IREF|((nowint \& (!(INTINH|itcntz))) \& RTN) \quad (3)$$

When the interrupt subroutine start signal IJMP is asserted, the counter 12 counts down. By referring to the interrupt subroutine start signal IJMP, the counter 12 decrements the count value itcnt in a sure manner in response to the start of the interrupt subroutine.

The interrupt subroutine start signal generating unit 20 generates the interrupt subroutine return signal IRTN which indicates that the flow is returned from the interrupt subroutine, in addition to the interrupt subroutine start signal IJMP.

When the return command RTN, which functions as a trigger, is received during execution of the interrupt subroutine, the interrupt subroutine return signal IRTN is asserted. However, the interrupt subroutine return signal IRTN should not be asserted in a repeating loop of the interrupt subroutine. Accordingly, the value of the count value itcnt is a target to be checked (condition 3).

When the DRAM 200 is in the active state, the interrupt operation is inhibited. Accordingly, the flow is unconditionally returned (condition 4). In this case, when the count value itcnt is not zero, the interrupt subroutine is resumed in a cycle in which the interrupt inhibition is released, at a stage where the flow returns from the interrupt subroutine.

When the following condition 3 or the following condition 4 is satisfied, the interrupt subroutine return signal IRTN is asserted.

Condition 3: During execution of the interrupt subroutine by the refresh circuit 4, the DRAM is not in the idle state, and the return signal RTN, which indicates return of the flow from the subroutine, is asserted.

Condition 4: During execution of the interrupt subroutine by the refresh circuit 4, the count value itcnt of the counter 12 is zero (itcntz), and the return signal RTN, which indicates return of the flow from the subroutine, is asserted.

When condition 4 is satisfied, the following logical Expression (4) holds true.

$$nowint \& itcntz \& RTN \quad (4)$$

When condition 3 is satisfied, the following Expression (5) holds true.

$$nowint \& INTINH \& RTN \quad (5)$$

By combining logical Expressions (4) and (5), the following logical Expression (6) is obtained.

$$IRTN=(nowint \& (INTINH|itcntz)) \& RTN \quad (6)$$

The interrupt judgment signal generating unit 18 generates the interrupt judgment signal nowint, which is asserted during execution of the interrupt subroutine by the refresh circuit 4.

When the interrupt start signal IREF is asserted, the interrupt judgment signal generating unit 18 asserts the interrupt judgment signal nowint.

Furthermore, when the interrupt subroutine return signal IRTN is asserted in the state in which the interrupt start signal IREF is negated, the interrupt judgment signal generating unit 18 negates the interrupt judgment signal nowint.

Moreover, when the interrupt subroutine return signal IRTN is negated in the state in which the interrupt start signal IREF is negated, the interrupt judgment signal generating unit 18 holds the interrupt judgment signal at its previous value.

The refresh error signal generating unit 22 generates the refresh error signal RFERR which is asserted when the count value itcnt of the counter 12 exceeds a predetermined upper limit value. When the refresh error signal RFERR is asserted, the test apparatus 100 stops the pattern generator PG that generates the interrupt signal REFTEND. The upper limit value can be set according to a maximum count setting signal ITMAX[15:0], which allows the settings to be made via an external circuit. With the embodiment, the maximum count setting signal ITMAX is configured as a 16-bit signal, and accordingly, such an arrangement is capable of holding a maximum of (64k-1) refresh interrupt events.

When the refresh signal REFTEND is asserted, and the interrupt subroutine start signal is not asserted in the state in which itcnt=ITMAX, the refresh error signal generating unit 22 asserts the refresh error signal RFERR, and holds this asserted value.

At the same time as the start of the program sequence, the start signal PGSTART is asserted. When the start signal PGSTART is asserted, the count value itcnt of the counter 12 is zero-cleared, and the interrupt judgment signal nowint of the interrupt judgment signal generating unit 18 is negated.

The mode signal DGMD is a mode signal used in the program counter. When the mode signal DGMD is "1", the count value itcnt is not cleared by the start signal PGSTART.

The write data signal WBUS[15:0] is data used to directly overwrite the count value itcnt of the counter 12 via an unshown bus. When the write command signal WE_ITCNT is asserted, the write data signal WBUS[15:0] is written to the counter 12. That is to say, the initial value of the count value itcnt of the counter 12 can be set via an external circuit.

The above is the configuration of the test apparatus 100 and the refresh control circuit 10. Next, description will be made regarding the operation of the test apparatus 100 with reference to several time charts.

Figure 4:
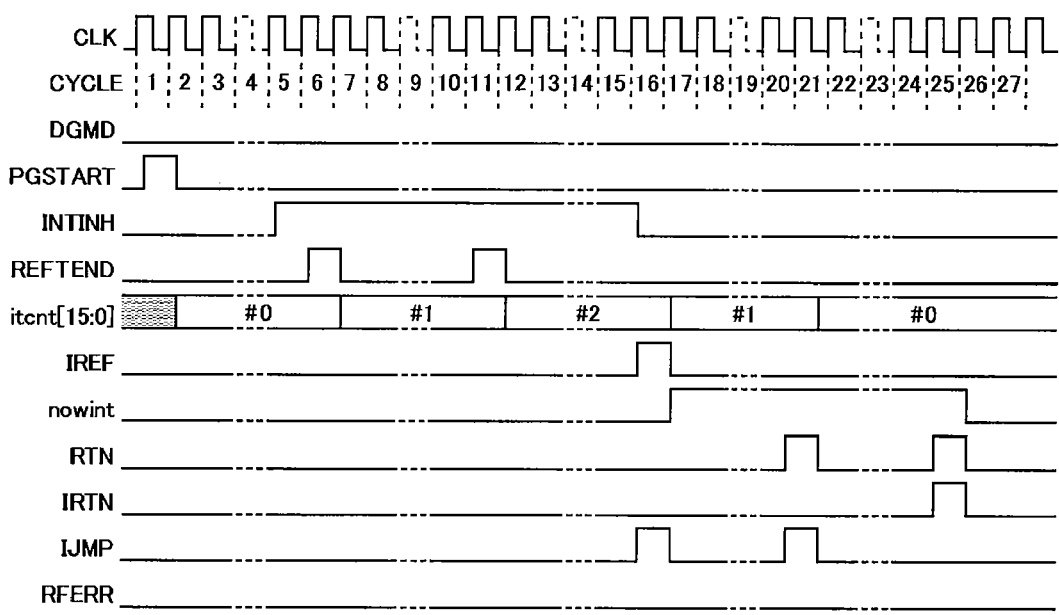
FIG. 4 is a time chart which shows a basic operation of the test apparatus.
Figure 5:
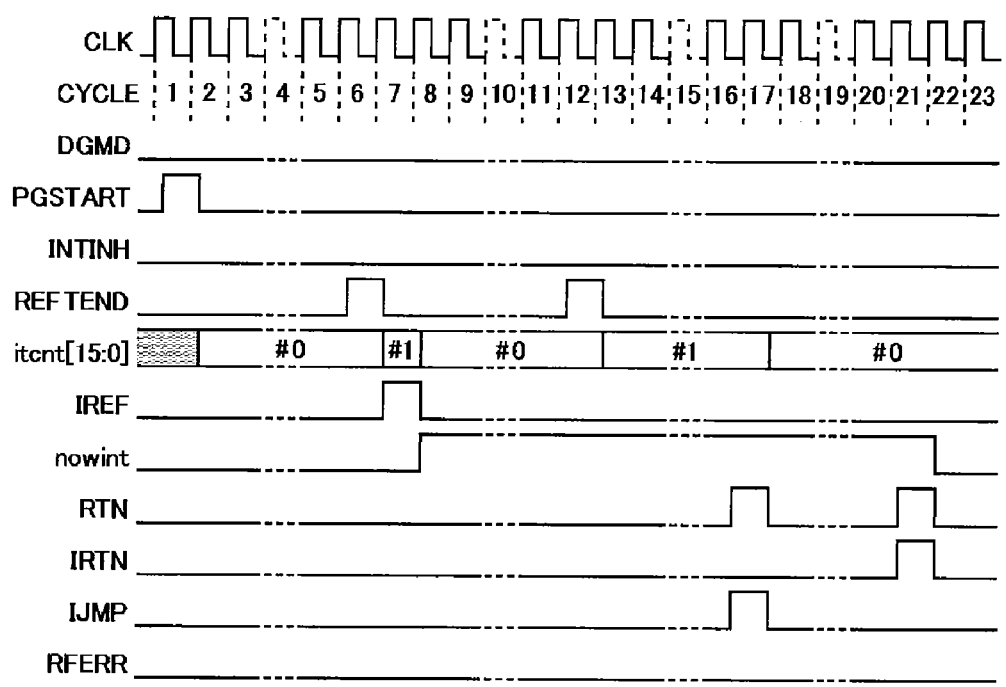
FIG. 5 is a diagram which shows the operation when an interrupt signal is asserted when an interrupt subroutine in a state in which an interrupt subroutine is executed.
Figure 6:
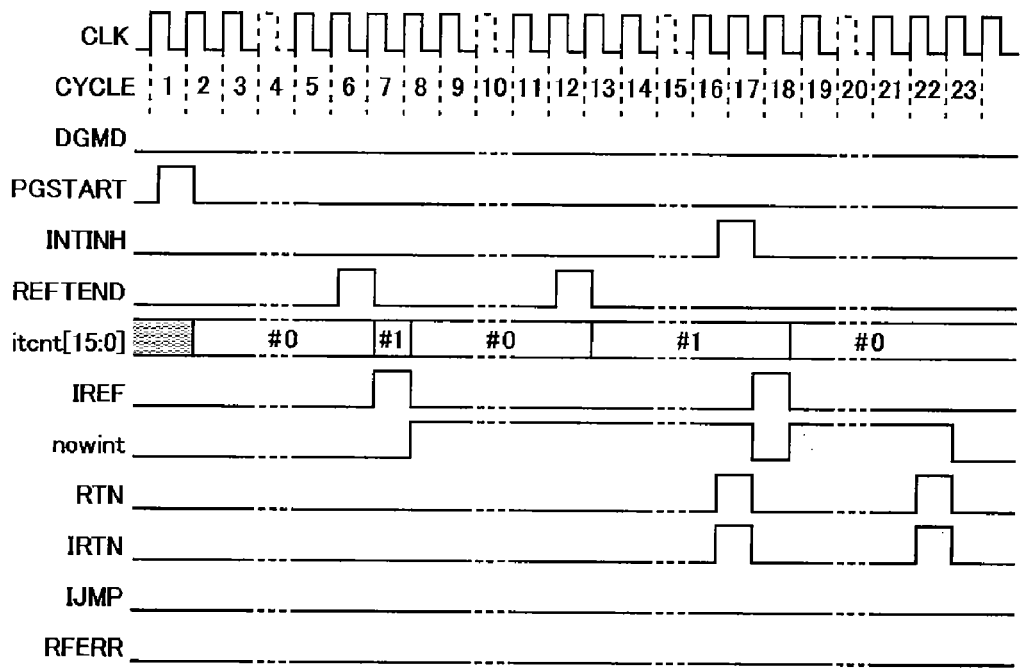
FIG. 6 is a time chart which shows the operation in a case in which an interrupt inhibit signal is asserted in a return cycle in which the flow returns from the interrupt subroutine.

FIGS. 4 to 6 are time charts showing the basic operation of the test apparatus 100.

As shown in FIG. 4, when the interrupt signal REFTEND is asserted in the state in which the interrupt inhibit signal INTINH is asserted (sixth cycle and eleventh cycle), the count value itcnt is incremented. When the interrupt inhibit signal INTINH is negated in the fifteenth cycle, condition 1 is satisfied in the sixteenth cycle, and the interrupt start signal IREF represented by logical Expression (1) is asserted. Furthermore, the interrupt subroutine start signal IJMP is asserted according to logical Expression (3). In the subsequent seventeenth cycle, the counter 12 is decremented. In the seventeenth cycle, the refresh operation is started, and the interrupt judgment signal nowint is asserted.

When the return signal RTN is asserted in the 21st cycle, condition 2 is satisfied. Accordingly, the interrupt subroutine start signal IJMP is asserted again, and the interrupt subroutine is executed. In the subsequent 22nd cycle, the count value itcnt is decremented to 0.

In the 25-th cycle, the return signal RTN is asserted. However, in this cycle, the count value itcnt is zero, and accordingly, the condition 2 is not satisfied. Thus, the interrupt subroutine start signal IJMP is not asserted, and the interrupt judgment signal nowint is negated.

FIG. 5 shows the operation when the interrupt signal REFTEND is asserted during execution of the interrupt subroutine. In the sixth cycle, the first interrupt signal REFTEND is asserted. In the seventh cycle, the count value itcnt is incremented, and the interrupt start signal IREF is asserted. In the eighth cycle, the interrupt subroutine is started. In this stage, the interrupt judgment signal nowint is asserted, and the count value itcnt is decremented and becomes zero.

The second interrupt signal REFTEND assert event occurs in the twelfth cycle in a period in which the interrupt judgment signal nowint is asserted. The count value itcnt is incremented upon detection of the second assertion of the interrupt signal REFTEND. In the seventeenth cycle, the return signal RTN is asserted. However, in this cycle, the count value itcnt is not zero, and accordingly, logical Expression (6) is not satisfied. Accordingly, the interrupt subroutine return signal IRTN is not asserted. Instead, the interrupt subroutine start signal IMP is asserted, the flow returns to the interrupt subroutine again, and the count value itcnt is decremented and becomes zero. When the flow returns from the interrupt subroutine again in the 21st cycle, logical Expression (6) is satisfied. Accordingly, the interrupt subroutine return signal IRTN is asserted, and the flow exits the loop.

FIG. 6 is a time chart which shows the operation when the interrupt inhibit signal INTINH is asserted in the return cycle in which the flow returns from the interrupt subroutine. In this case, the flow unconditionally returns from the interrupt subroutine. That is to say, the flow returns from the interrupt subroutine regardless of whether or not the count value itcnt is zero.

In the eighth cycle and the subsequent cycles, the interrupt subroutine is started, and the interrupt judgment signal nowint is asserted. When the return signal RTN and the interrupt inhibit signal INTINH are asserted in the seventeenth cycle, condition 3 is satisfied although the count value itcnt is not zero. Accordingly, the interrupt subroutine return signal IRTN is asserted. Subsequently, in the subsequent eighteenth cycle, the interrupt judgment signal nowint is negated. Immediately after the interrupt inhibit signal INTINH is negated in the eighteenth cycle, the interrupt start signal IREF is asserted again, which enables the interrupt subroutine to be started.

Figure 7:
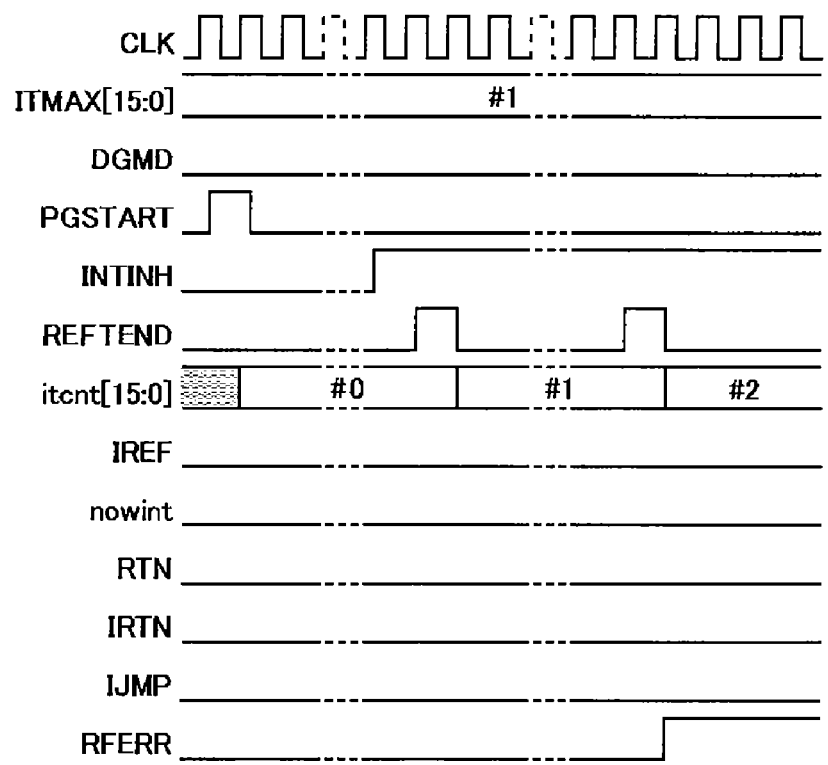
FIG. 7 is a time chart which shows the operation in which a refresh error signal is asserted.

FIG. 7 is a time chart which shows a case in which the refresh error signal is asserted. In the time chart shown in FIG. 7, the ITMAX is set to 1. On the second assertion of the interrupt signal REFTEND in the state in which the interrupt inhibit signal INTINH is asserted, the count value itcnt becomes 2, and accordingly, the count value itcnt becomes greater than the upper limit value 1. At this timing, the refresh error signal RFERR is asserted.

Figure 8:
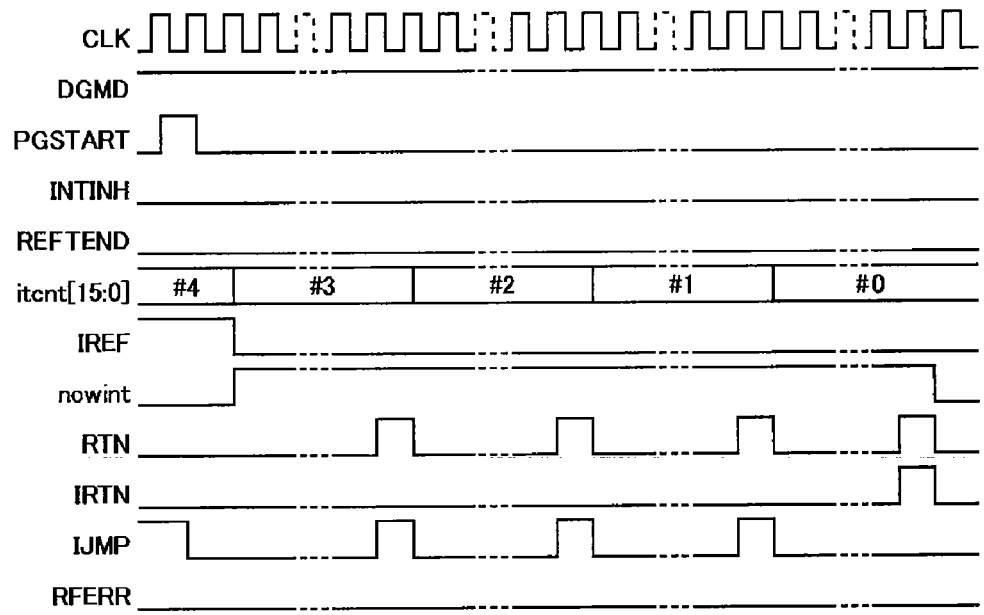
FIG. 8 is a time chart in a case in which the count value is set to an initial value.

FIG. 8 is a time chart which shows a case in which the count value is set to an initial value. With the write data signal WBUS[15:0] set to ( . . . 100), the initial count value itcnt is set to 4. When the start signal PGSTART is asserted in the state in which the mode signal DGMD is set to 1, the program is executed without initializing the counter 12. After four assertions of the interrupt subroutine start signal IJMP, the count value itcnt becomes zero. In this state, when the interrupt subroutine return signal IRTN is asserted, the refresh operation is completed.

As described, by supplying the write data signal WBUS [15:0] so as to set the count value itcnt to an initial value, and by starting the program in the state in which the mode signal DGMD is set "1", to such an arrangement is capable of setting beforehand the number of times the refresh pattern (interrupt subroutine) is to be executed.

While the preferred embodiments of the present invention have been described using specific terms, such description is for illustrative purposes only, and it is to be understood that changes and variations may be made without departing from the spirit or scope of the appended claims.

What is claimed is:

1. A test apparatus for DRAM (Dynamic Random Access Memory) comprising:
   a refresh control circuit configured to receive an interrupt signal which is asserted at predetermined timings and which is a request to refresh the DRAM, to count the number of times the interrupt signal is asserted, and to assert an interrupt subroutine start signal in order to refresh the DRAM in an idle state in which the DRAM is accessible from an external circuit, for a number of times that is equal to the number of times thus counted; and
   a refresh circuit configured to execute a predetermined interrupt subroutine so as to supply a refresh pattern to the DRAM when the interrupt subroutine start signal is asserted.

2. A test apparatus according to claim 1, wherein the refresh control circuit comprises a counter configured to count up when the interrupt signal is asserted, and to count down when the refresh circuit starts the interrupt subroutine.

3. A test apparatus according to claim 2, wherein the refresh control circuit comprises an interrupt subroutine start signal generating unit configured to generate the interrupt subroutine start signal,
   and wherein the interrupt subroutine start signal generating unit is configured to assert the interrupt subroutine start signal in a state selected from among a state in which the DRAM is in the idle state, the refresh circuit is not executing the interrupt subroutine, and the count value of the counter is not zero, and a state in which the refresh circuit is executing the interrupt subroutine, the DRAM is in the idle state, the count value is not zero, and a return signal, which indicates return of the flow from a subroutine, is asserted.

4. A test apparatus according to claim 3, wherein, when the interrupt subroutine start signal is asserted, the counter counts down.

5. A test apparatus according to claim 3, wherein the interrupt subroutine start signal generating unit generates an interrupt subroutine return signal, which indicates return of the flow from the interrupt subroutine, in addition to the interrupt subroutine start signal,
   and wherein the interrupt subroutine start signal generating unit asserts the interrupt subroutine return signal in a state selected from among a state in which the refresh circuit is executing the interrupt subroutine, the DRAM is not in the idle state, and the return signal, which indicates return of the flow from the subroutine, is asserted, and a state in which the refresh circuit is executing the interrupt subroutine, the count value of the counter is zero, and the return signal, which indicates return of the flow from the subroutine, is asserted.

6. A test apparatus according to claim 5, wherein the refresh control circuit further comprises:
   an interrupt start signal generating unit configured to generate an interrupt start signal which is asserted when the DRAM is in the idle state, the refresh circuit is not executing the interrupt subroutine, and the count value of the counter is not zero; and an interrupt judgment signal generating unit configured to generate an interrupt judgment signal that indicates that the refresh circuit is executing the interrupt subroutine, and wherein the interrupt judgment signal generating unit asserts the interrupt judgment signal when the interrupt start signal is asserted, and wherein the interrupt judgment signal generating unit negates the interrupt judgment signal when the interrupt subroutine return signal is asserted in a state in which the interrupt start signal is negated, and wherein the interrupt judgment signal generating unit holds the interrupt judgment signal at its previous value when the interrupt subroutine return signal is negated in a state in which the interrupt start signal is negated.

7. A test apparatus according to claim 2, wherein the refresh control circuit comprises a refresh error signal generating unit configured to generate a refresh error signal which is asserted when the count value of the counter exceeds a predetermined upper limit value, and wherein, when the refresh error signal is asserted, the test apparatus stops the operation of the pattern generator configured to generate the interrupt signal.

8. A test apparatus according to claim 2, wherein an initial value of the count value of the counter can be set via an external circuit.

9. A test method for DRAM (Dynamic Random Access Memory) comprising:

generating an interrupt signal which is asserted at predetermined timings and which is a request to refresh the DRAM;

counting the number of times the interrupt signal is asserted;

asserting an interrupt subroutine start signal in order to refresh the DRAM in an idle state in which the DRAM is accessible from an external circuit, for a number of times that is equal to the number of times thus counted; and executing a predetermined interrupt subroutine so as to supply a refresh pattern to the DRAM when the interrupt subroutine start signal is asserted.

10. A test method according to claim 9, wherein, in the counting operation, the counter counts up when the interrupt signal is asserted, and the counter counts down when the interrupt subroutine is started.

11. A test method according to claim 10, further comprising generating the interrupt subroutine start signal, and wherein the interrupt subroutine start signal is asserted in a state selected from among a state in which the DRAM is in the idle state, the interrupt subroutine is not being executed, and the count value of the counter is not zero, and a state in which the interrupt subroutine is being executed, the DRAM is in the idle state, the count value is not zero, and a return signal, which indicates return of the flow from a subroutine, is asserted.

12. A test method according to claim 11, wherein, when the interrupt subroutine start signal is asserted, the counter counts down.

13. A test method according to claim 11, further comprising generating an interrupt subroutine return signal which indicates return of the flow from the interrupt subroutine, wherein the interrupt subroutine return signal is asserted in a state selected from among a state in which the interrupt subroutine is being executed, the DRAM is not in the idle state, and the return signal, which indicates return of the flow from the subroutine, is asserted, and a state in which the interrupt subroutine is being executed, the count value of the counter is zero, and the return signal, which indicates return of the flow from the subroutine, is asserted.

14. A test method according to claim 13, further comprising:

generating an interrupt start signal which is asserted when the DRAM is in the idle state, the interrupt subroutine is not being executed, and the count value of the counter is not zero; and generating an interrupt judgment signal which indicates that the interrupt subroutine is being executed, wherein the interrupt judgment signal is asserted when the interrupt start signal is asserted, and wherein the interrupt judgment signal is negated when the interrupt subroutine return signal is asserted in a state in which the interrupt start signal is negated, and wherein the interrupt judgment signal is held at its previous value when the interrupt subroutine return signal is negated in a state in which the interrupt start signal is negated.

15. A test method according to claim 10, further comprising generating a refresh error signal which is asserted when the count value of the counter exceeds a predetermined upper limit value, and wherein, when the refresh error signal is asserted, the operation for generating the interrupt signal is stopped.

* * * * *

UNITED STATES PATENT AND TRADEMARK OFFICE
CERTIFICATE OF CORRECTION

| | |
|---|---|
| PATENT NO. | : 8,345,496 B2 |
| APPLICATION NO. | : 12/990983 |
| DATED | : January 1, 2013 |
| INVENTOR(S) | : Takashi Nakamura |

It is certified that error appears in the above-identified patent and that said Letters Patent is hereby corrected as shown below:

Title Page, Item (54) and in the specification, column 1, lines 1-2, the title "MEMORY TEST APPARATUS AND TESTING METHOD" should be replaced with the title "TEST APPARATUS AND TEST METHOD FOR MEMORY".

Signed and Sealed this
Second Day of April, 2013

Teresa Stanek Rea
*Acting Director of the United States Patent and Trademark Office*